(12) United States Patent
Walker et al.

(10) Patent No.: US 8,633,763 B2
(45) Date of Patent: Jan. 21, 2014

(54) OUTPUT CIRCUITS WITH CLASS D AMPLIFIER

(75) Inventors: Brett C Walker, San Diego, CA (US); Song Stone Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/198,642

(22) Filed: Aug. 4, 2011

(65) Prior Publication Data

US 2011/0285472 A1    Nov. 24, 2011

Related U.S. Application Data

(62) Division of application No. 11/748,828, filed on May 15, 2007, now Pat. No. 8,022,756.

(51) Int. Cl.
*H03F 3/68* (2006.01)
(52) U.S. Cl.
USPC ........................................ 330/10; 330/207 A
(58) Field of Classification Search
USPC ................. 330/10, 207 A, 251; 375/238, 239
See application file for complete search history.

(56) References Cited

U.S. PATENT DOCUMENTS

| | | | |
|---|---|---|---|
| 4,458,208 | A | 7/1984 | Abe |
| 4,689,819 | A | 8/1987 | Killion |
| 5,345,165 | A | 9/1994 | Froeschle |
| 5,347,587 | A | 9/1994 | Takahashi et al. |
| 5,506,532 | A | 4/1996 | Milazzo |
| 6,297,693 | B1 | 10/2001 | Pullen |
| 6,300,825 | B1 | 10/2001 | Dijkmans et al. |
| 6,348,780 | B1 | 2/2002 | Grant |
| 6,362,683 | B1 | 3/2002 | Miao et al. |
| 6,653,878 | B2 | 11/2003 | Nolan |
| 6,778,011 | B2 | 8/2004 | Noro et al. |
| 7,023,268 | B1 | 4/2006 | Taylor et al. |
| 7,046,080 | B2 | 5/2006 | Watts et al. |

(Continued)

FOREIGN PATENT DOCUMENTS

| | | | |
|---|---|---|---|
| JP | 05152867 A | * | 6/1993 |
| JP | 2006191250 | | 7/2006 |
| TW | 269646 | | 7/2005 |

OTHER PUBLICATIONS

Chang J.S., et al., "A novel low-power low-voltage class D amplifier with feedback for improving THD, power efficiency and gain linearity", Nanyang Technological University, Singapore, 639798, 0-7803-6685-9/01, 2001, pp. I-635 to I-1638.

Ge T., et al., "Modeling and Anaylsis of PSRR in Analog PWM Class D Amplifiers," Nanyang Technological University, Singapore, 0-7803-9390-2/06, ISCAS 2006, pp. 1386-1389.

(Continued)

*Primary Examiner* — Khanh V Nguyen
(74) *Attorney, Agent, or Firm* — William M Hooks

(57) ABSTRACT

Output circuits using pulse width modulation (PWM) and/or pulse density modulation (PDM) are described. In one aspect, a PWM output circuit includes a PWM modulator that operates based on a square wave signal instead of a sawtooth or triangular wave signal. In another aspect, a PDM output circuit includes a PDM modulator that uses variable reference voltages to reduce variations in switching frequency. In yet another aspect, a dual-mode output circuit supports both PWM and PDM and includes a pulse modulator and a class D amplifier. The pulse modulator performs PWM on an input signal if a PWM mode is selected and performs PDM on the input signal if a PDM mode is selected. The class D amplifier receives a driver signal from the pulse modulator and generates an output signal.

21 Claims, 10 Drawing Sheets

(56) References Cited

U.S. PATENT DOCUMENTS

| | | |
|---|---|---|
| 7,075,803 B2 | 7/2006 | Eberlein |
| 7,190,225 B2 | 3/2007 | Edwards |
| 7,332,943 B2 | 2/2008 | Botti et al. |
| 7,342,447 B2 | 3/2008 | Zhao et al. |
| 7,385,444 B2 | 6/2008 | Kurokawa |
| 7,459,968 B2 * | 12/2008 | Ohama et al. ............... 330/10 |
| 7,463,089 B1 * | 12/2008 | Bapat et al. ............... 330/10 |
| 7,518,442 B1 * | 4/2009 | Dijkstra et al. ............ 330/10 |
| 7,557,522 B2 * | 7/2009 | Ku et al. ................. 315/307 |
| 8,022,756 B2 | 9/2011 | Walker et al. |
| 2011/0285463 A1 | 11/2011 | Walker et al. |

OTHER PUBLICATIONS

Grosso, A., et al., "A 250W Audio Amplifier with Straightforward Digital Input—PWM Output Conversion," Proc. ESSCIRC, pp. 225-228, (Sep. 2001).

International Search Report and Written Opinion—PCT/US2008/060232, International Search Authority—European Patent Office—Sep. 10, 2008.

PowerDAC: A single-chip audio DAC with a 70%-efficient power stage in 0.5um CMOS, 0-7803-5126-6/99.

SOPA: A high-efficiency line driver in 0.35 um CMOS using a self-oscillating power amplifier, 0-7803-6608-5, Feb. 7, 2001.

Taiwan Search Report—TW097117733—TIPO—Oct. 12, 2011.

* cited by examiner

OUTPUT CIRCUITS WITH CLASS D AMPLIFIER

CLAIM OF PRIORITY UNDER 35 U.S.C. §120

The present Application for Patent is a divisional of patent application Ser. No. 11/748,828 entitled "OUTPUT CIRCUITS WITH CLASS D AMPLIFIER" filed May 15, 2007, allowed, and assigned to the assignee hereof and hereby expressly incorporated by reference herein.

BACKGROUND

I. Field

The present disclosure relates generally to electronics circuits, and more specifically to output circuits for electronics devices.

II. Background

Output amplifiers are commonly used in various applications such as audio power amplifiers, telephone line drivers, etc. Output amplifiers may be categorized into different classes such as class A, class B, class AB and class D. Class A, B and AB amplifiers are linear amplifiers that operate in linear region. Class D amplifiers are switch mode amplifiers that operate in triode and cut-off regions. Consequently, class D amplifiers can typically achieve much higher power efficiency than linear amplifiers.

A class D amplifier is commonly used with a modulation technique such as pulse width modulation (PWM) or pulse density modulation (PDM). A PWM modulator may receive an analog input signal and a carrier signal and generate a PWM signal that controls the switching of the class D amplifier. The PWM signal has a variable duty cycle determined by the amplitude of the analog input signal and a fixed switching frequency determined by the frequency of the carrier signal. The carrier signal may have a sawtooth waveform or a triangular waveform. Any deviation from an ideal sawtooth or triangular waveform may cause distortion in an output signal from the class D amplifier.

A PDM modulator may receive an analog input signal and generate a PDM signal that controls the switching of the class D amplifier. The PDM signal has a duty cycle determined by the analog input signal and may have a variable switching frequency determined by circuit components within the PDM modulator. The values of the circuit components may vary widely due to integrated circuit (IC) process variations and other factors. Hence, the switching frequency of the PDM signal may also vary widely.

SUMMARY

Output circuits using pulse width modulation (PWM) and/or pulse density modulation (PDM) and having improved performance/characteristics are described herein. In an aspect, a PWM output circuit includes a PWM modulator that operates based on a square wave signal instead of a sawtooth or triangular wave signal. In one design, the PWM output circuit includes an integrator and a comparator that collectively perform PWM on an input signal and a class D amplifier that generates an output signal. The integrator sums and integrates the input signal, the square wave signal, and the output signal and provides an integrated signal. The comparator compares the integrated signal against a fixed reference voltage and generates a driver signal. The class D amplifier receives the driver signal and generates the output signal. A clock divider may receive and divide a clock signal in frequency to generate the square wave signal.

In another aspect, a PDM output circuit includes a PDM modulator that uses variable reference voltages to reduce variations in switching frequency. In one design, the PDM output circuit includes an integrator and a comparator that collectively perform PDM on an input signal, a class D amplifier that generates an output signal, and a reference generator. The integrator sums and integrates the input and output signals and provides an integrated signal. The comparator compares the integrated signal against adjustable reference voltages and generates a driver signal. The class D amplifier receives the driver signal and generates the output signal. The reference generator generates the adjustable reference voltages such that variations in the switching frequency of the driver signal is reduced. For example, the reference generator may generate first and second reference voltages having a difference that is inversely related to a feedback resistor in the integrator, related to a power supply voltage, etc.

In yet another aspect, a dual-mode output circuit supports both PWM and PDM. In one design, the dual-mode output circuit includes a pulse modulator and a class D amplifier. The pulse modulator performs PWM on an input signal if a PWM mode is selected, performs PDM on the input signal if a PDM mode is selected, and provides a driver signal. The pulse modulator may include an integrator and a comparator. The integrator sums and integrates the input signal and an output signal (and also a square wave signal in the PWM mode) and provides an integrated signal. The comparator compares the integrated signal against a fixed reference voltage in the PWM mode and against first and second reference voltages in the PDM mode. The class D amplifier receives the driver signal from the comparator and generates the output signal.

Various aspects and features of the disclosure are described in further detail below.

DETAILED DESCRIPTION

Figure 1:
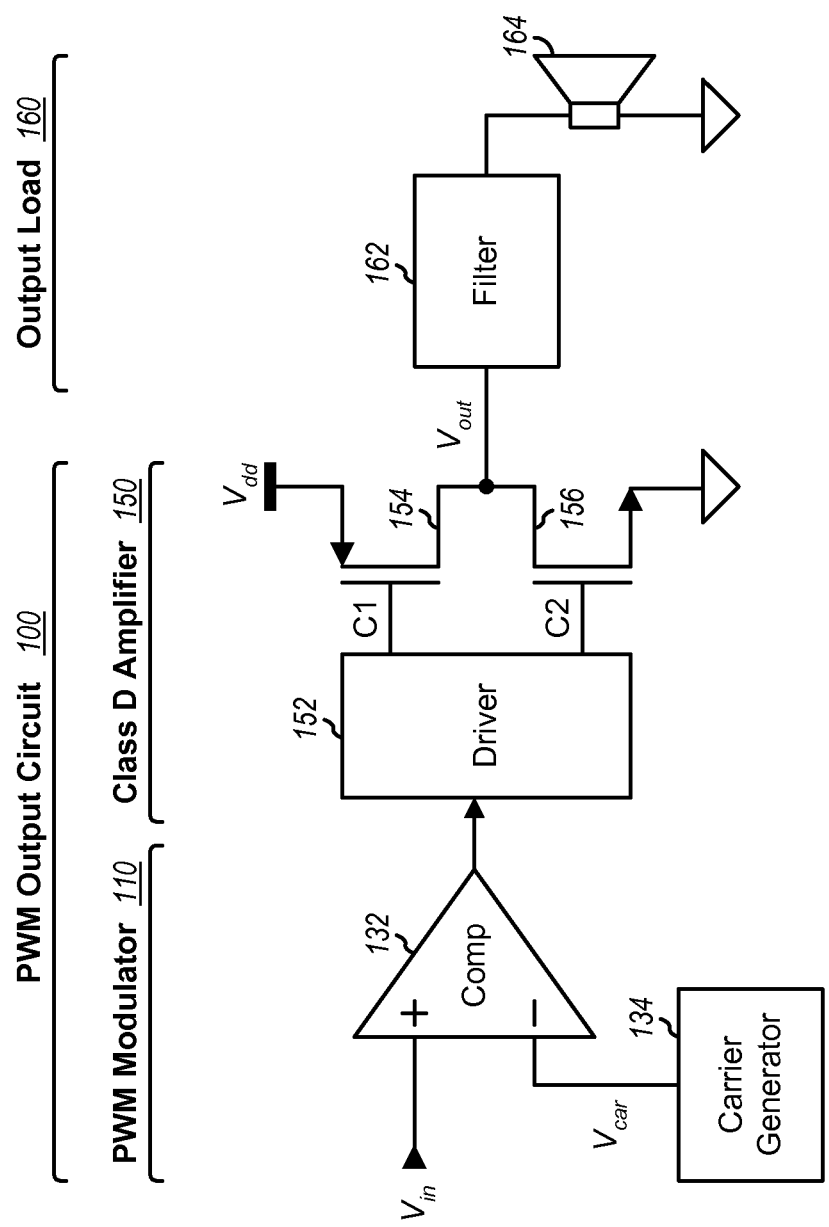
FIG. 1 shows an open-loop PWM output circuit.

FIG. 1 shows a schematic diagram of an open-loop PWM output circuit 100 driving an output load 160. PWM output circuit 100 includes a PWM modulator 110 and a class D amplifier 150.

Within PWM modulator 110, a comparator (Comp) 132 receives an analog input signal $V_{in}$ at a non-inverting input and a carrier signal $V_{car}$ at an inverting input, compares the two signals, and provides a PWM driver signal. A carrier generator 134 generates the carrier signal at a fixed frequency. The carrier signal may have a sawtooth waveform, a triangular waveform, etc. The PWM driver signal is digital in nature and toggles between logic high (e.g., a power supply voltage $V_{dd}$) and logic low (e.g., circuit ground). The PWM driver signal has a variable duty cycle determined by the amplitude of the analog input signal and a fixed switching frequency determined by the frequency of the carrier signal.

Within class D amplifier 150, a driver 152 receives the PWM driver signal and generates a first control signal C1 for a P-channel field effect transistor (P-FET) 154 and a second control signal C2 for an N-channel FET (N-FET) 156. Driver 152 generates the first and second control signals such that only P-FET 154 or N-FET 156 is turned on at any given moment and the P-FET and N-FET are turned on and off at appropriate times. P-FET 154 has its source coupled to the power supply $V_{dd}$, its gate receiving the first control signal, and its drain coupled to the drain of N-FET 156. N-FET 156 has its gate receiving the second control signal and its source coupled to circuit ground. The drains of FETs 154 and 156 provide an output signal $V_{out}$ for class D amplifier 150.

Within output load 160, a filter 162 receives and filters the output signal from class D amplifier 150 and provides a filtered signal to a load 164. Filter 162 may be a lowpass filter, a bandpass filter, etc. Filter 162 may also perform DC blocking. Load 164 may be a speaker (as shown in FIG. 1) or some other type of load.

PWM output circuit 100 operates as follows. Comparator 132 generates a pulse in the PWM driver signal for each period or cycle of the carrier signal. The width of the pulse is determined by the amplitude of the analog input signal, which may be considered as providing a variable reference against which the carrier signal is compared. The PWM driver signal contains a stream of pulses. Driver 152 generates the first and second control signals based on the PWM driver signal. Ideally, when the PWM driver signal is at logic high, P-FET 154 is turned off, N-FET 156 is turned on, and the output signal is pulled low. Conversely, when the PWM driver signal is at logic low, P-FET 154 is turned on, N-FET 156 is turned off, and the output signal is pulled high. The second control signal may resemble the PWM driver signal, and the first control signal may resemble an inverted version of the PWM driver signal. The first and second control signals may also be generated to achieve a desired amount of non-overlap between the two control signals to obtain the desired output signal characteristics.

The output signal is digital in nature and includes harmonics of the carrier/switching frequency. Filter 162 filters the output signal to pass the desired signal component and remove extraneous high frequency components. Since the switching frequency is typically much higher than the bandwidth of the desired signal, filter 162 may be implemented with a simple low-order filter, e.g., an LC filter composed of an inductor (L) and a capacitor (C).

PWM output circuit 100 has several drawbacks. First, the total harmonic distortion (THD) of the output signal is dependent on the fidelity of the carrier signal from generator 134. Any deviation from an ideal sawtooth or triangular waveform may result in the PWM driver signal containing pulses with inaccurate duty cycles, which may then cause distortion in the output signal. Second, noise on the power supply is coupled to the output signal. The power supply rejection ratio (PSRR) is approximately 6 decibels (dBs), which means that the noise in the power supply is attenuated by only one half in the output signal.

Figure 2:
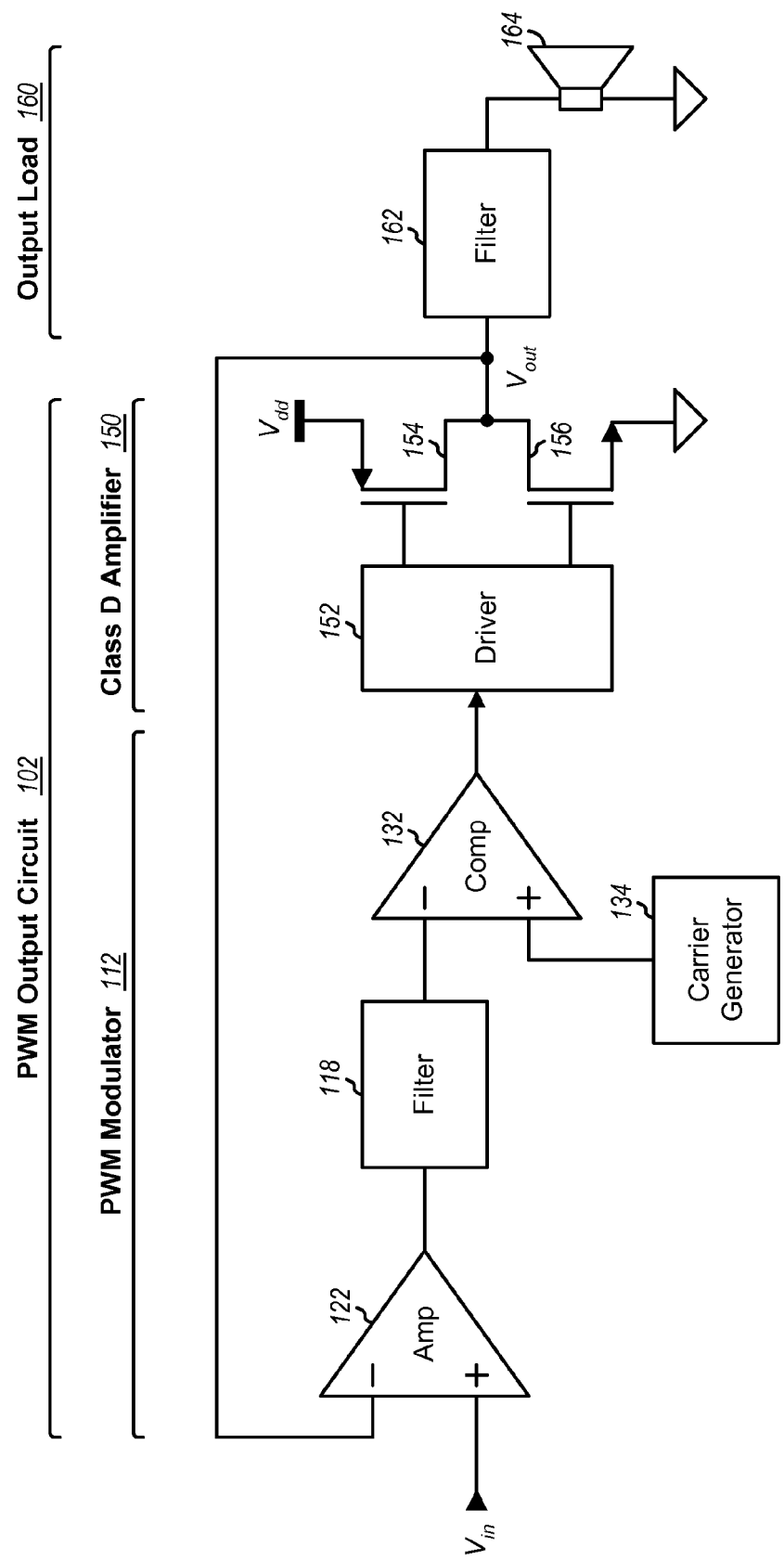
FIG. 2 shows a closed-loop PWM output circuit.

FIG. 2 shows a schematic diagram of a closed-loop PWM output circuit 102, which includes a PWM modulator 112 and class D amplifier 150. Within PWM modulator 112, an amplifier (Amp) 122 receives an analog input signal $V_{in}$ at a non-inverting input and a feedback signal at an inverting input and provides an amplified signal. The feedback signal is equal to an output signal $V_{out}$ from class D amplifier 150. A filter 118 filters the amplified signal with a filter response and provides a filtered signal to the inverting input of a comparator 132. Comparator 132 also receives a carrier signal $V_{car}$ at its non-inverting input and provides a PWM driver signal to driver 152 within class D amplifier 150.

Figure 3:
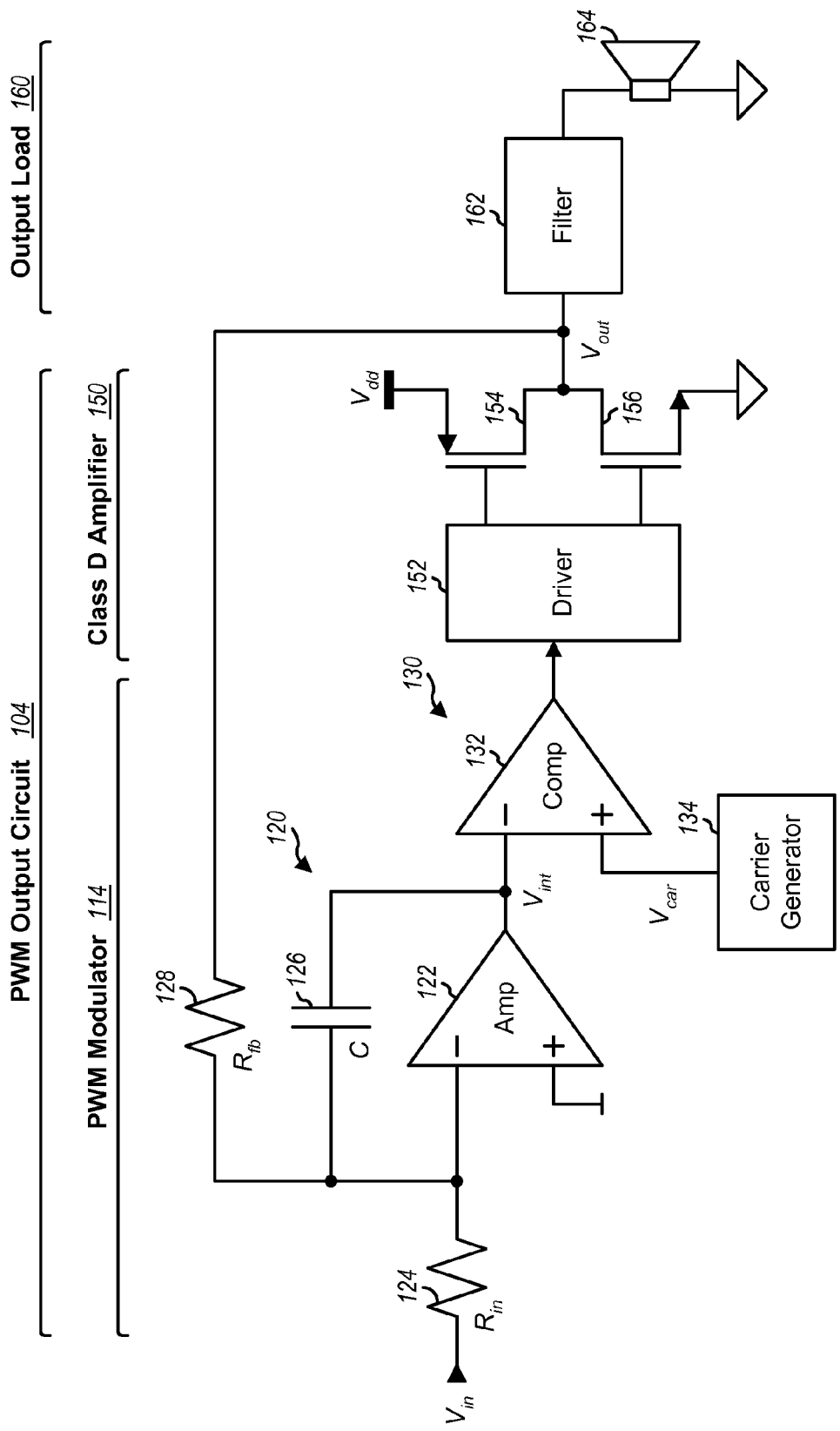
FIG. 3 shows another closed-loop PWM output circuit.

FIG. 3 shows a schematic diagram of a closed-loop PWM output circuit 104, which includes a PWM modulator 114 and class D amplifier 150. PWM modulator 114 includes a summer integrator 120 followed by a comparator section 130. Summer integrator 120 performs summing function for the closed-loop feedback and also implements filter 118 in FIG. 2.

Integrator 120 includes amplifier 122, resistors 124 and 128, and a capacitor 126. Resistor 124 has one end coupled to an inverting input of amplifier 122 and the other receiving an analog input signal V. Capacitor 126 has one end coupled to the inverting input of amplifier 122 and the other end coupled to an output of the amplifier. Resistor 128 has one end coupled to the inverting input of amplifier 122 and the other end coupled to the output of class D amplifier 150. Amplifier 122 has its non-inverting input coupled to a reference voltage $V_{ref}$ and its output coupled to the non-inverting input of comparator 132. Comparator 132 receives a carrier signal $V_{car}$ at its inverting input and provides a PWM driver signal to driver 152 within class D amplifier 150.

Resistor 128 provides feedback from the output of class D amplifier 150 to PWM modulator 114. Integrator 120 sums the analog input signal and the feedback signal and further integrates the summed signal to generate an integrated signal V. The integrated signal includes an integrated analog input signal and an integrated feedback signal. The integrated signal is provided to and operated on by comparator 132 and class D amplifier 150 in the same manner as comparator 132 and class D amplifier 150 in FIG. 1.

The use of feedback in PWM output circuit 104 improves both THD and PSRR. The amount of improvement in THD and PSRR is dependent on (a) a forward gain determined by components of integrator 120 and (b) a feedback gain determined by resistors 124 and 128. However, a sawtooth or triangular carrier signal is still used for comparator 132.

In an aspect, a PWM output circuit includes a PWM modulator that operates based on a square wave signal instead of a sawtooth or triangular wave signal. The square wave signal may be much easier to generate than the sawtooth or triangular wave signal.

Figure 4:
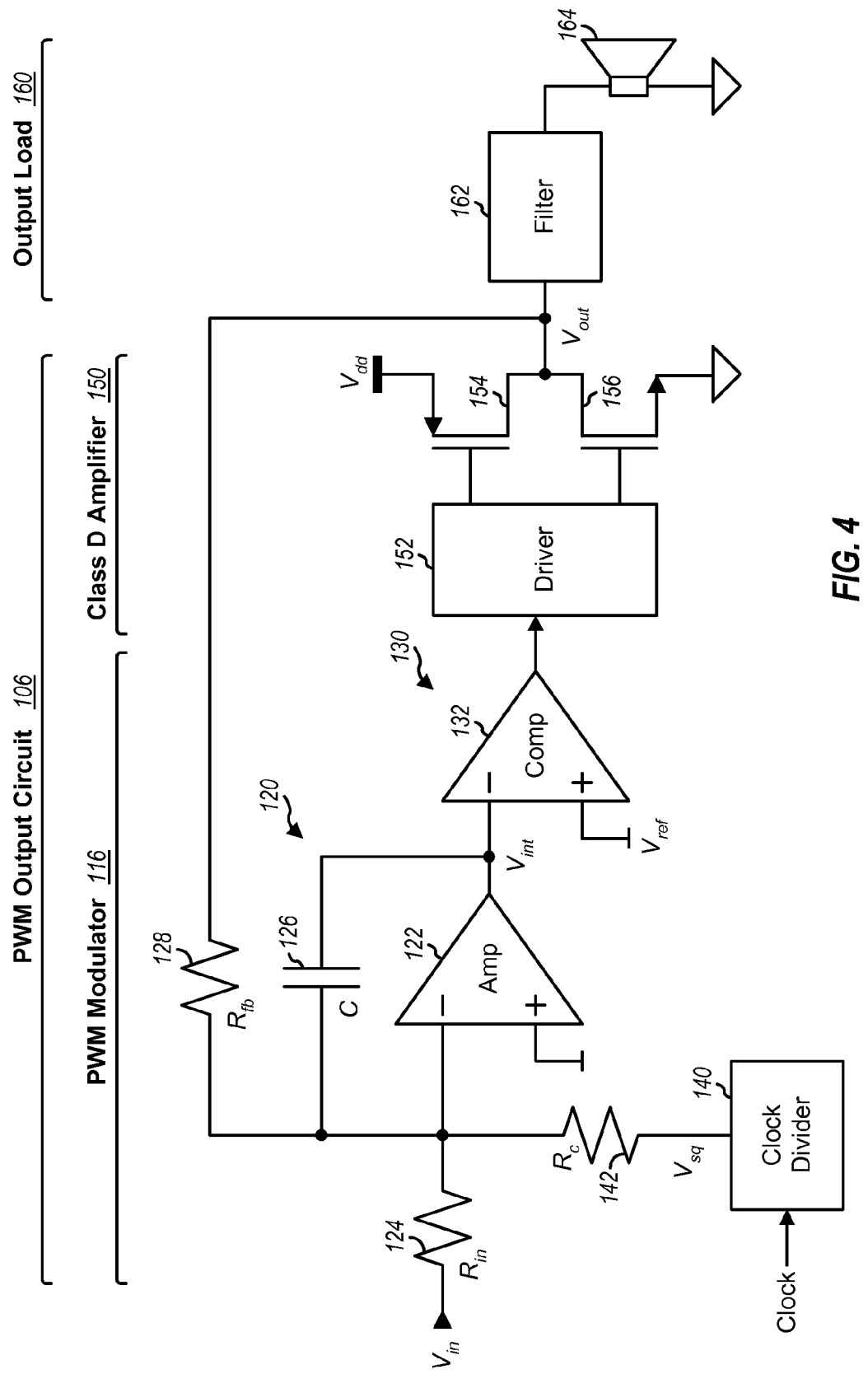
FIG. 4 shows a closed-loop PWM output circuit using a square wave signal.

FIG. 4 shows a schematic diagram of a closed-loop PWM output circuit 106 that uses a square wave signal. PWM output circuit 106 includes a PWM modulator 116 and class D amplifier 150. PWM modulator 116 includes circuit elements/components 122 through 132 that are coupled as described above for PWM modulator 114 in FIG. 3. However, the inverting input of comparator 132 is coupled to a reference voltage $V_{ref}$ instead of carrier generator 134. PWM modulator 116 further includes a clock divider 140 and a resistor 142. Clock divider 140 receives a clock signal, divides the clock signal in frequency, and provides a square wave signal $V_{sq}$ with 50% duty cycle. Resistor 142 has one end coupled to clock divider 140 and the other end coupled to the inverting input of amplifier 122.

Integrator 120 sums the analog input signal, the feedback signal, and the square wave signal and further integrates the summed signal to generate an integrated signal $V_{int}$. The integrated signal includes the integrated analog input signal, the integrated feedback signal, and the integrated square wave signal. Comparator 132 compares the integrated signal from integrator 120 against the reference voltage and generates a PWM driver signal.

PWM modulator 116 uses a square wave injected at the input of integrator 120 instead of a sawtooth or triangular wave at the input of comparator 132. Integrator 120 converts the square wave into a triangular wave and adds it to the integrated signal. Resistor 128 in the feedback path may be implemented with the same type of resistor (e.g., fabricated with the same IC processing steps) as resistor 124 in the forward path for the analog input signal. In this case, the feedback and forward paths automatically track one another over IC process, temperature, and power supply (PVT) variations.

In general, any suitable values may be selected for the components of PWM modulator 116. In one design, resistor 142 has a value that is one half of the value of feedback resistor 128. This choice of resistor values provides a 2 to 1 ratio in the slopes of the integrated square wave signal to the integrated feedback signal. Other values may also be selected for resistors 124, 128 and 142 and capacitor 126.

The use of a square wave signal may simplify the design of PWM output circuit 106. A square wave with 50% duty cycle and toggling between logic high and logic low may be easily generated based on any clock signal commonly available in an electronics device. It is generally easier to obtain 50% duty cycle square wave than good fidelity for sawtooth or triangular wave. Furthermore, clock divider 140 is typically much easier to implement than a sawtooth or triangular wave generator.

Figure 5:
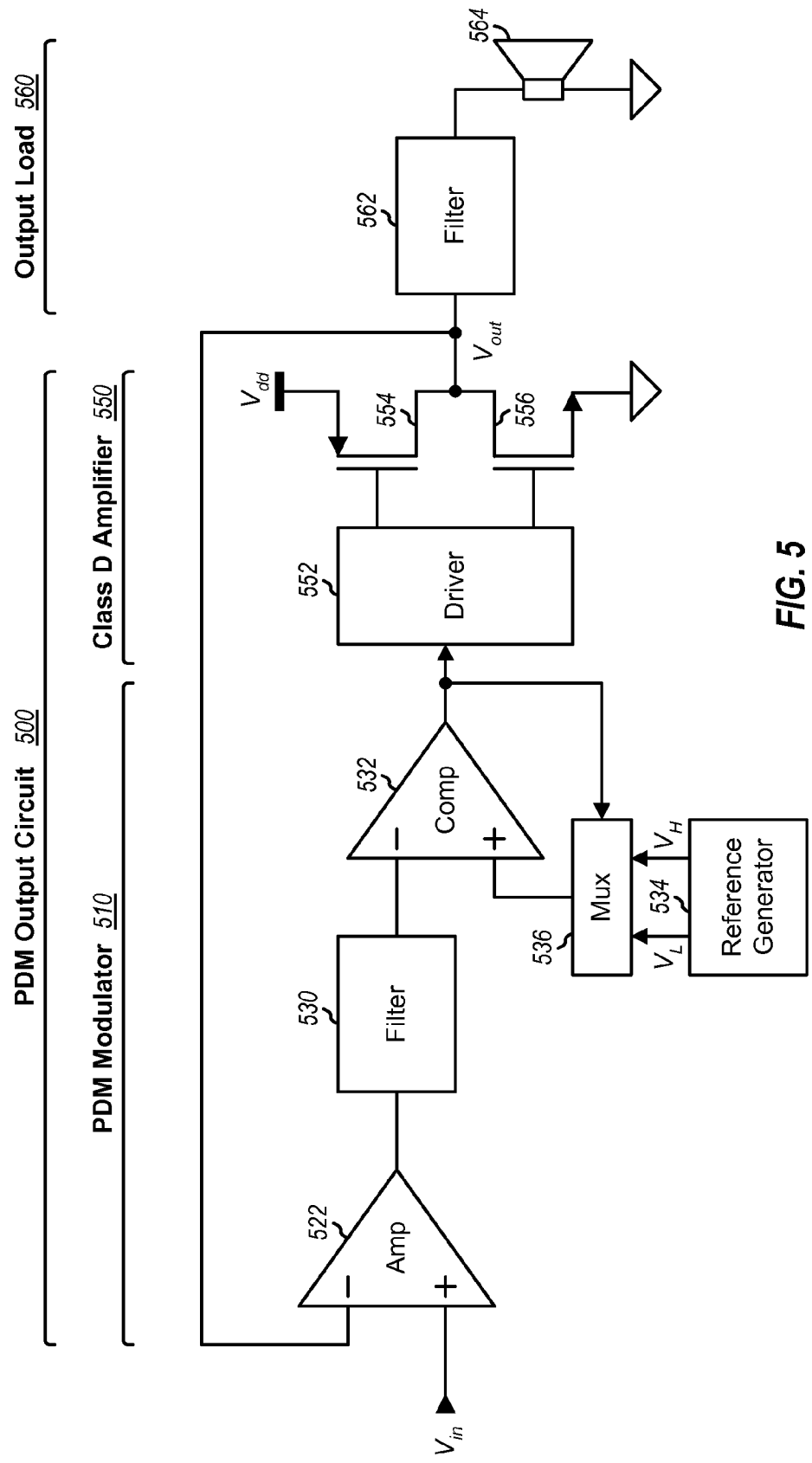
FIG. 5 shows a closed-loop PDM output circuit.

FIG. 5 shows a schematic diagram of a closed-loop PDM output circuit 500 driving an output load 560. PDM output circuit 500 includes a PDM modulator 510 and a class D amplifier 550.

Within PDM modulator 510, an amplifier 522 receives an analog input signal $V_{in}$ at a non-inverting input and a feedback signal at an inverting input and provides an amplified signal. The feedback signal is equal to an output signal $V_{out}$ from class D amplifier 550. A filter 530 filters the amplified signal with a filter response and provides a filtered signal. A comparator 532 receives the filtered signal at an inverting input and a reference signal at a non-inverting input, compares the two signals, and provides a PDM driver signal. A reference generator 534 generates the reference signal as described below. The PDM driver signal has a density determined by the analog input signal and a switching frequency determined by various components such as filter 530.

Class D amplifier 550 includes a driver 552, a P-FET 554, and an N-FET 556 that are coupled in the same manner as driver 152, P-FET 154, and N-FET 156, respectively, in FIGS. 1 through 4. Output load 560 includes a filter 562 and a load 564 that are coupled in the same manner as filter 162 and load 164, respectively, in FIGS. 1 through 4.

Generator 534 generates reference voltages $V_L$ and $V_H$ for the reference signal provided to comparator 532. A multiplexer (Mux) 536 receives the two reference voltages from generator 534, provides the low reference voltage $V_L$ to comparator 532 when the PDM driver signal is at logic high, and provides the high reference voltage $V_H$ when the PDM driver signal is at logic low. The use of two reference voltages provides hysteresis for comparator 532.

A loop is formed by amplifier 522, filter 530, comparator 532 and class D amplifier 550. The loop is designed to be unstable when no analog input signal is applied and to oscillate at a particular switching frequency. This switching frequency is determined by the response of filter 530, the high and low reference voltages provided to comparator 532, and the propagation delay through comparator 532 and class D amplifier 550.

PDM output circuit 500 operates as follows. When no analog input signal is applied, self-oscillation of the loop results in the PDM driver signal from comparator 532 containing square waves at the switching frequency. This self-oscillation occurs as follows. If the output of comparator 532 is at logic low, then $V_{out}$ is low, and $V_H$ is provided to the inverting input of comparator 532. If $V_{in}$ is at midscale, then the output of amplifier 522 goes high, and the output of filter 530 transitions high at a rate determined by the response of the filter. After the filtered signal exceeds $V_H$, the output of comparator 532 transitions to logic high, $V_{out}$ goes high, and $V_L$ is provided to the inverting input of comparator 532. The output of amplifier 522 then goes low, and the output of filter 530 transitions low at a rate determined by the response of the filter. After the filtered signal drops below $V_L$, the output of comparator 532 transitions to logic low, $V_{out}$ goes low, and $V_H$ is provided to the inverting input of comparator 532. The output of amplifier 522 then goes high, and a new switching cycle starts. One period of the switching frequency is thus dependent on (a) the response of filter 530, which determines how fast the filtered signal transitions high and low, (b) the reference voltages $V_H$ and $V_L$, which determine how much the filtered signal needs to transition to cause comparator 532 to switch, and (c) other components that determine the delay through the loop.

When the analog input signal is applied, the PDM driver signal from comparator 532 contains pulses with variable widths determined by the analog input signal. The square wave from the loop self-oscillation acts as dither. The PDM driver signal contains the analog input signal and the switching frequency.

Figure 6:
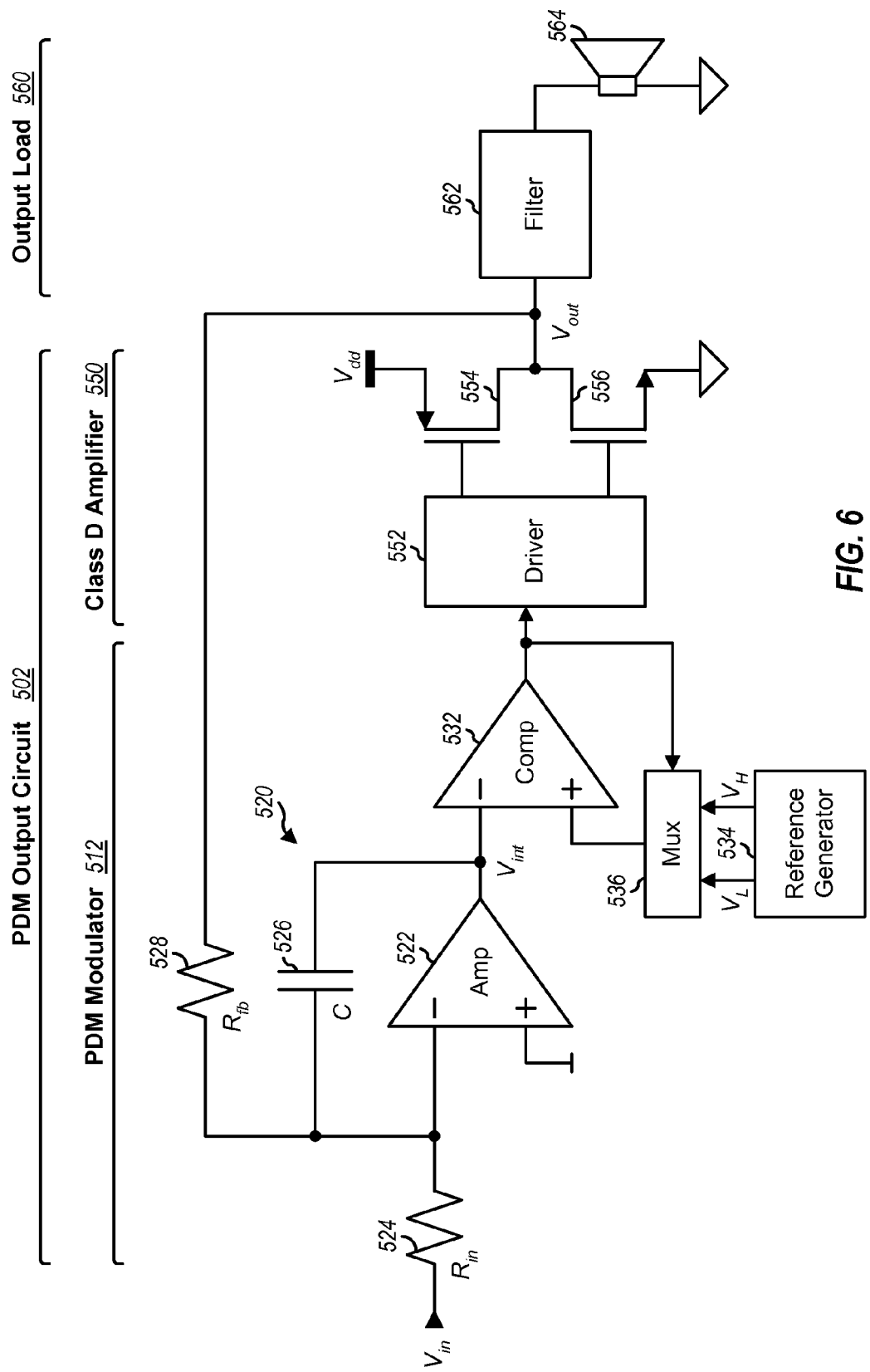
FIG. 6 shows a closed-loop PDM output circuit with adjustable reference voltages.

FIG. 6 shows a schematic diagram of a closed-loop PDM output circuit 502, which includes a PDM modulator 512 and class D amplifier 550. PDM modulator 512 implements filter 530 in FIG. 5 with a summer integrator 520. Integrator 520 includes amplifier 522, resistors 524 and 528, and capacitor 526 that are coupled in the same manner as amplifier 122, resistors 124 and 128, and a capacitor 126, respectively, in FIG. 3.

For PDM output circuit 502, one period of the switching frequency may be expressed as:

$$T_{sw} = \frac{4}{1 - 4 \cdot (V_{in}/V_{dd})^2} \cdot \left( \Delta t + \frac{R_{fb} \cdot C \cdot \Delta V}{V_{dd}} \right), \quad \text{Eq (1)}$$

where
$T_{sw}$ is one period of the switching frequency,
C is the value of integrator capacitor 526,
$R_{fb}$ is the value of feedback resistor 528,
$V_{mid}$ is a midscale reference voltage, which is $V_{mid} \approx (V_H + V_L)/2$,
$\Delta V$ is a comparator window size, which is $\Delta V = V_H - V_L$, and
$\Delta t$ is the propagation delay from comparator 532 to the output signal.

As shown in equation (1), the switching period is dependent on various parameters. The values of some of these parameters may vary widely. For example, the feedback resistor $R_{fb}$ may vary by more than 50% across IC process, voltage, and temperature (PVT). The integrator capacitor C may also vary by a large amount across PVT. The power supply voltage $V_{dd}$ may range, e.g., from 3.3 to 4.4 Volts. The switching frequency may thus vary widely due to large variations in one or more of the parameters in equation (1).

In another aspect, variable reference voltages are used to account or compensate for variations in one or more parameters affecting the switching frequency. The second term $R_{fb} \cdot C \cdot \Delta V / V_{dd}$ in the second part of equation (1) may be much larger than the first term $\Delta t$. Hence, the reference voltages may be generated such that the term $R_{fb} \cdot C \cdot \Delta V / V_{dd}$ has small variation. This may be achieved by generating the comparator window size $\Delta V$, as follow:

$$\Delta V = \frac{K \cdot V_{dd}}{R_{fb} \cdot C}, \qquad \text{Eq (2)}$$

where K is a constant.

As shown in equation (2), to obtain small variation in $R_{fb} \cdot C \cdot \Delta V / V_{dd}$, the comparator window size $\Delta V$ may be generated such that it is proportional to the power supply voltage $V_{dd}$ and inversely proportional to the feedback resistance $R_{fb}$ and the integrator capacitance C. A translinear circuit may be used to generate the reference voltages $V_L$ and $V_H$ to adaptively track variations in $V_{dd}$, $R_{fb}$ and C, or any combination of these parameters over PVT. Small variation in $R_{fb} \cdot C \cdot \Delta V / V_{dd}$ due to use of an adaptive $\Delta V$ may result in small variation in the switching frequency, which is desirable.

The reference voltages may also be generated to account for variations in the analog input signal and/or other parameters. This may be achieved by generating the comparator window size $\Delta V$, as follow:

$$\Delta V = \frac{K \cdot V_{dd}}{R_{fb} \cdot C} \cdot [1 - (V_{in}/V_{mid})^2] - \frac{\Delta t \cdot V_{dd}}{R_{fb} \cdot C}. \qquad \text{Eq (3)}$$

The term to the right of the minus sign in equation (3) may be ignored if $\Delta t$ is small.

As shown in equation (3), the comparator window size $\Delta V$ may be generated such that it is proportional to $[1-(V_{in}/V_{mid})^2]$ and follows the input signal in real time.

The use of feedback in PDM output circuit 502 improves both THD and PSRR. The amount of improvement in THD and PSRR is dependent on the forward and feedback gains. The use of adaptive reference voltages reduces variations in the switching frequency of PDM modulator 512. All of these features may improve the performance of PDM output circuit 502.

In yet another aspect, a dual-mode output circuit includes a pulse modulator that supports both PWM and PDM. As shown in FIGS. 4 and 6, PWM output circuit 106 in FIG. 4 closely resembles PDM output circuit 502 in FIG. 6. This is achieved by (a) using a summing integrator for the feedback signal and (b) injecting a square wave signal into the integrator instead of a sawtooth or triangular wave signal into the comparator. The dual-mode output circuit may be efficiently implemented with mostly circuits that are common to both PWM and PDM and some additional circuits that are specific to PWM or PDM.

Figure 7:
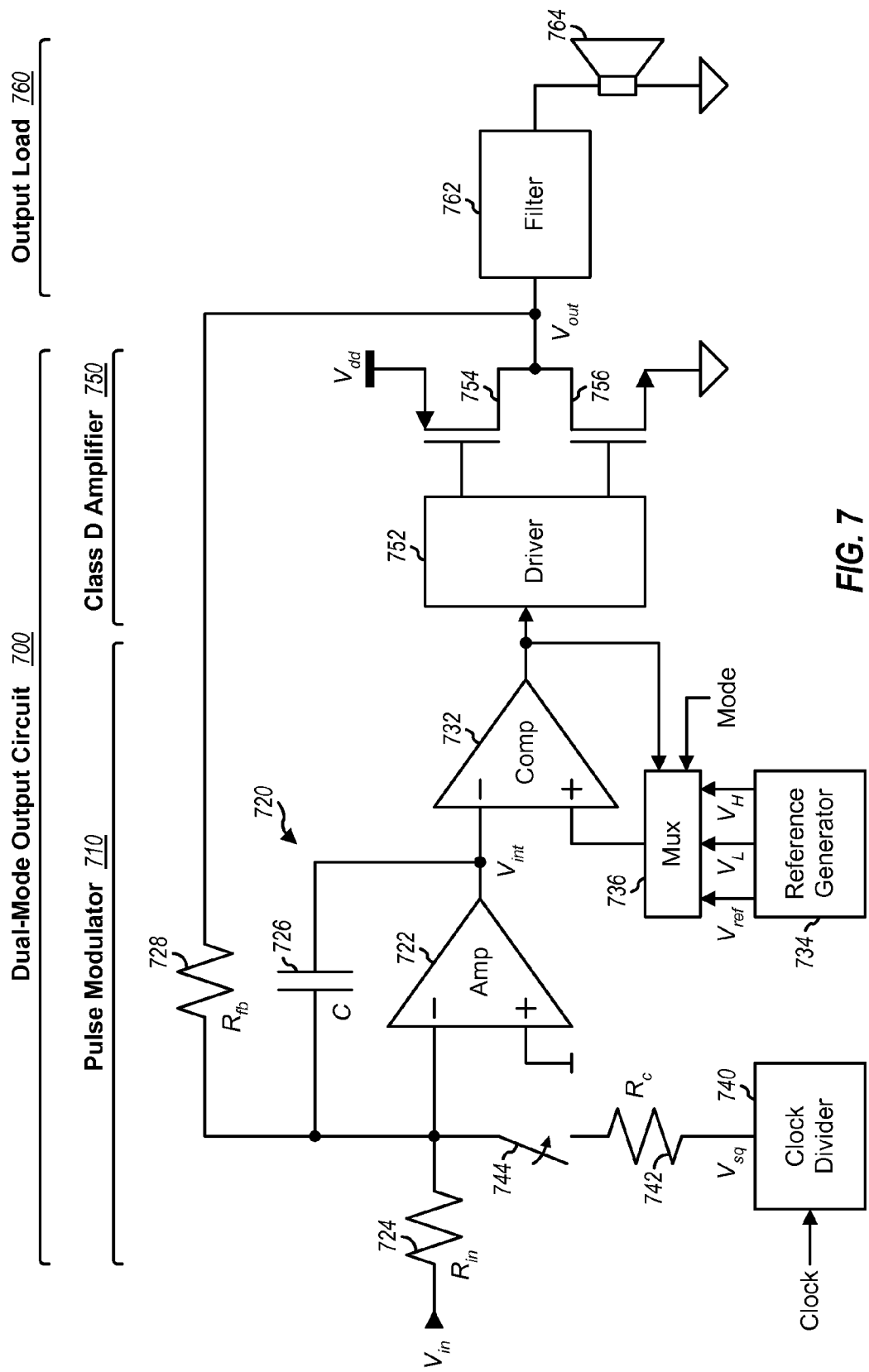
FIG. 7 shows a closed-loop dual-mode output circuit.

FIG. 7 shows a schematic diagram of a closed-loop dual-mode output circuit 700 driving an output load 760. Dual-mode output circuit 700 includes a pulse modulator 710 and a class D amplifier 750. Pulse modulator 710 can operate in either a PWM mode or a PDM mode, which may be selected via a Mode control signal.

Within pulse modulator 710, an amplifier 722, resistors 724 and 728, and a capacitor 726 of an integrator 720, a comparator 732, a reference generator 734, and a multiplexer 736 are coupled as described above for PDM output circuit 502 in FIG. 6. Generator 734 generates three reference voltages $V_{ref}$, $V_L$, and $V_H$. In the PWM mode, multiplexer 736 provides reference voltage $V_{ref}$ of comparator 732. In the PDM mode, multiplexer 736 provides either the low reference voltage $V_L$ or the high reference voltage $V_H$ to comparator 732 at any given moment depending on the output of the comparator. Pulse modulator 710 further includes a clock divider 740, a resistor 742, and a switch 744. Clock divider 740 receives a clock signal and generates a square wave signal in the PWM mode. Resistor 742 has one end coupled to the output of clock divider 740 and the other end coupled to one end of switch 744. The other end of switch 744 is coupled to the inverting input of amplifier 722. Switch 744 is closed in the PWM mode and opened in the PDM mode. Table 1 summarizes the operation of switch 744 and reference generator 734 for the PWM and PDM modes.

TABLE 1

| Mode | Switch 744 | Multiplexer 736 |
|------|------------|-----------------|
| PWM  | closed     | $V_{ref}$       |
| PDM  | open       | $V_L$ and $V_H$ |

FIGS. 1 through 7 show singled-ended PWM, PDM and dual-mode output circuits. Differential PWM, PDM and dual-mode output circuits may also be designed and used to achieve certain benefits such as improved linearity, dynamic range, PSRR, and rejection of common mode signals, greater output power since the voltage applied to the load may be doubled, etc.

Figure 8:
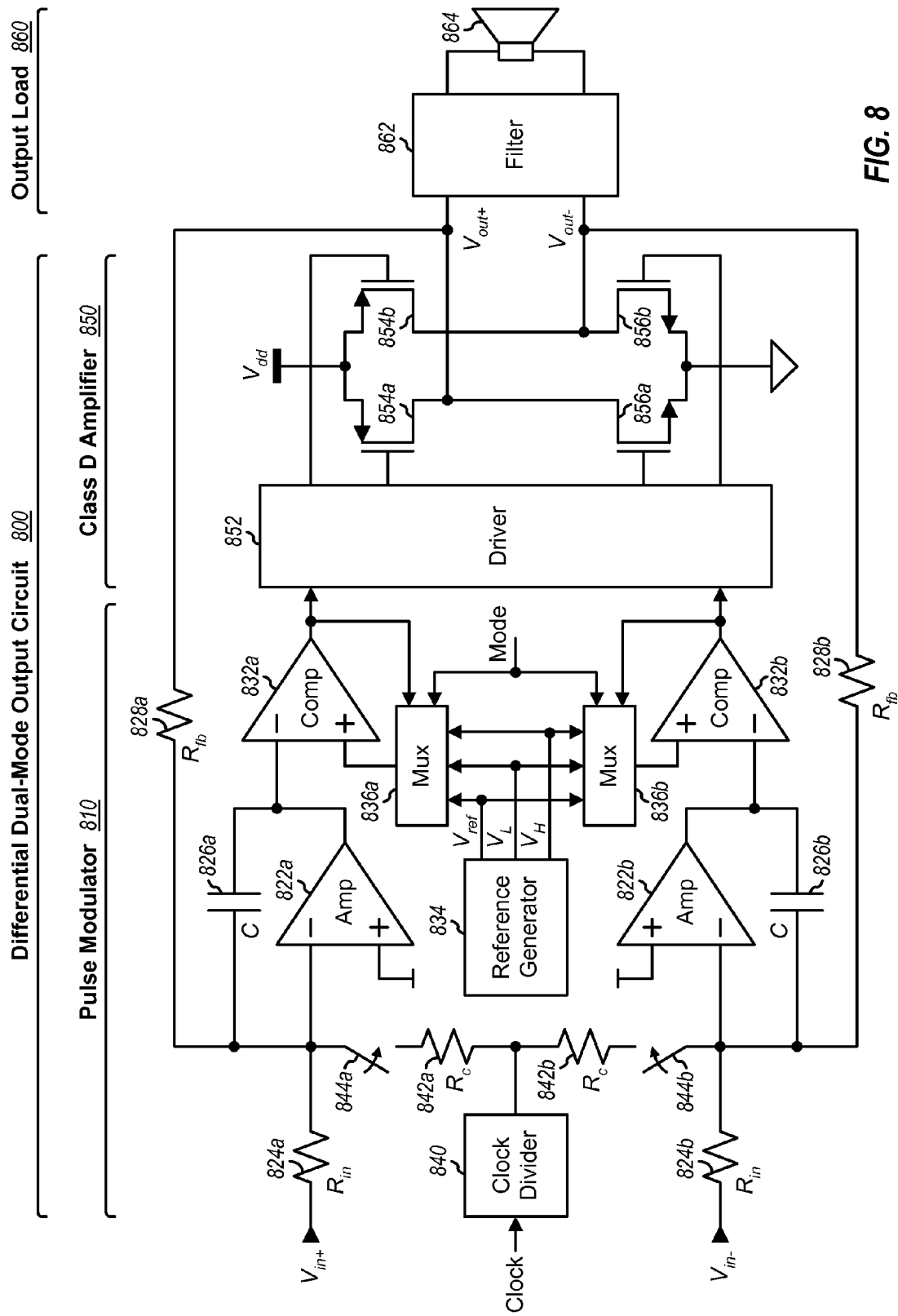
FIG. 8 shows a differential closed-loop dual-mode output circuit.

FIG. 8 shows a schematic diagram of a differential closed-loop dual-mode output circuit 800 driving an output load 860. Differential dual-mode output circuit 800 includes a pulse modulator 810 and a class D amplifier 850. Pulse modulator 810 can operate in either a PWM mode or a PDM mode.

Pulse modulator 810 includes a non-inverting path composed of an amplifier 822a, resistors 824a, 828a and 842a, a capacitor 826a, a switch 844a, and a comparator 832a that are coupled as described above for amplifier 722, resistors 724, 728 and 742, capacitor 726, switch 744 and comparator 732, respectively, in FIG. 7. Pulse modulator 810 further includes an inverting path composed of an amplifier 822b, resistors 824b, 828b and 842b, a capacitor 826b, a switch 844b, and a comparator 832b that are coupled in the same manner as amplifier 822a, resistors 824a, 828a and 842a, capacitor 826a, switch 844a, and comparator 832a, respectively. Resistor 824a receives a non-inverting input signal $V_{in+}$, and resistor 824b receives an inverting input signal $V_{in-}$. Resistors 844a and 874b both couple to a clock divider 840 that provides a square wave signal. The non-inverting inputs of comparators 832a and 832b couple to the outputs of multiplexers 836a and 836b, respectively. A reference generator 834 generates three reference voltages $V_{ref}$, $V_L$, and $V_H$. In the PWM mode, multiplexers 836a and 836b provide the reference voltage $V_{ref}$ to comparators 832a and 832b, respectively. In the PDM mode, multiplexer 836a provides the low reference voltage $V_L$, to comparator 832a when the comparator output is at logic high and provides the high reference voltage $V_H$ to comparator 832a when the comparator output is at logic low. Similarly, multiplexer 836b provides either the low or high reference voltage to comparator 832b at any given moment. In the PDM mode, the low reference voltage $V_L$, is provided to one comparator and the high reference voltage $V_H$ is provided to the other comparator at any given moment.

Figure 9:
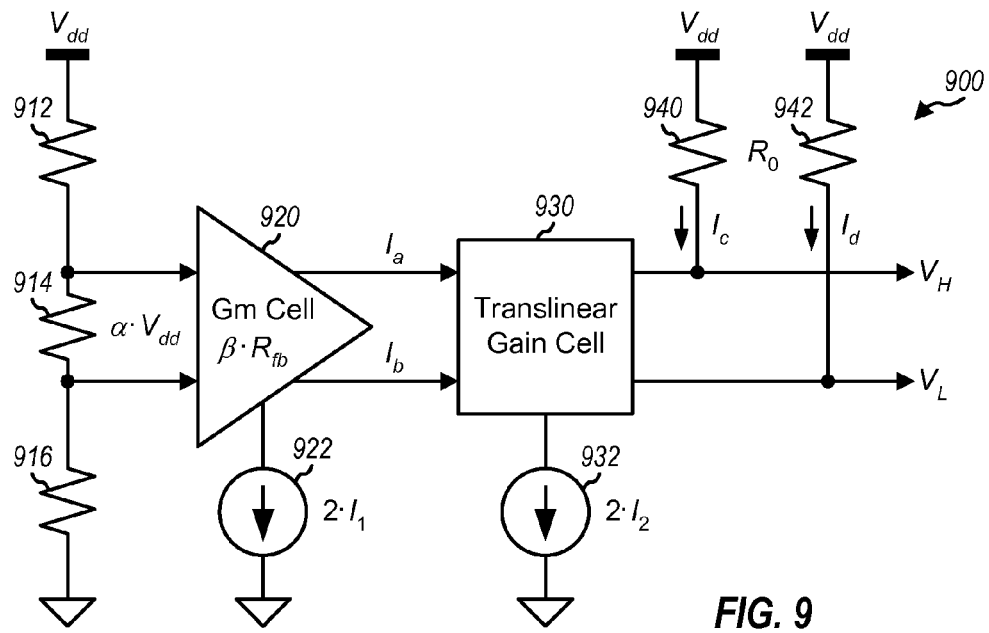
FIG. 9 shows a reference generator.

FIG. 9 shows a schematic diagram of a design of a reference generator 900, which may be used for reference generators 534, 634, 734 and 834 in FIGS. 5, 6, 7 and 8, respectively. Within reference generator 900, resistors 912, 914 and 916 are coupled in series and between the power supply voltage $V_{dd}$ and circuit ground. Resistors 912, 914 and 916 are designed such that the ratio of the value of resistor 914 to the total value of all three resistors is $\alpha$. The voltage across resistor 914 is thus a $\alpha \cdot V_{dd}$. A gm cell (transconductance amplifier) 920 has its differential input coupled across resistor 914, its bias input coupled to a current source 922, and its differential output coupled to the differential input of a translinear gain cell 930. Gain cell 930 has its bias input coupled to a current source 932 and its differential output coupled to resistors 940 and 942 and providing the reference voltages $V_H$ and $V_L$, respectively. Resistors 940 and 942 are further coupled to the power supply voltage $V_{dd}$. Current source 922 provides a bias current of $2I_1$ for gm cell 920, and current source 932 provides a bias current of $2I_2$ for gain cell 930. gm cell 920 has a gain of $1/(\beta \cdot R_{fb})$.

The currents at the differential output of gm cell 920 may be expressed as:

$$I_a = I_1 - \frac{\alpha \cdot V_{dd}}{\beta \cdot R_{fb}} \text{ and } I_b = I_1 + \frac{\alpha \cdot V_{dd}}{\beta \cdot R_{fb}}. \qquad \text{Eq (4)}$$

The currents at the differential output of gain cell 930 may be expressed as:

$$I_c = I_2 + \frac{I_2 \cdot \alpha \cdot V_{dd}}{I_1 \cdot \beta \cdot R_{fb}} \text{ and } I_d = I_2 - \frac{I_2 \cdot \alpha \cdot V_{dd}}{I_1 \cdot \beta \cdot R_{fb}}. \qquad \text{Eq (5)}$$

The reference voltages $V_H$ and $V_L$ may be expressed as:

$$V_H = I_c \cdot R_0 \text{ and } V_L = I_d \cdot R_0. \qquad \text{Eq (6)}$$

The comparator window size $\Delta V$ may be expressed as:

$$\Delta V = V_H - V_L = \frac{2 I_2 \cdot \alpha \cdot V_{dd} \cdot R_0}{I_1 \cdot \beta \cdot R_{fb}}. \qquad \text{Eq (7)}$$

In equation (7), comparator window size $\Delta V$ is a function of the power supply voltage $V_{dd}$ and the feedback resistance $R_{fb}$. Equation (7) may implement equation (2) if $\beta$ is a function of the integrator capacitance C.

Figure 10:
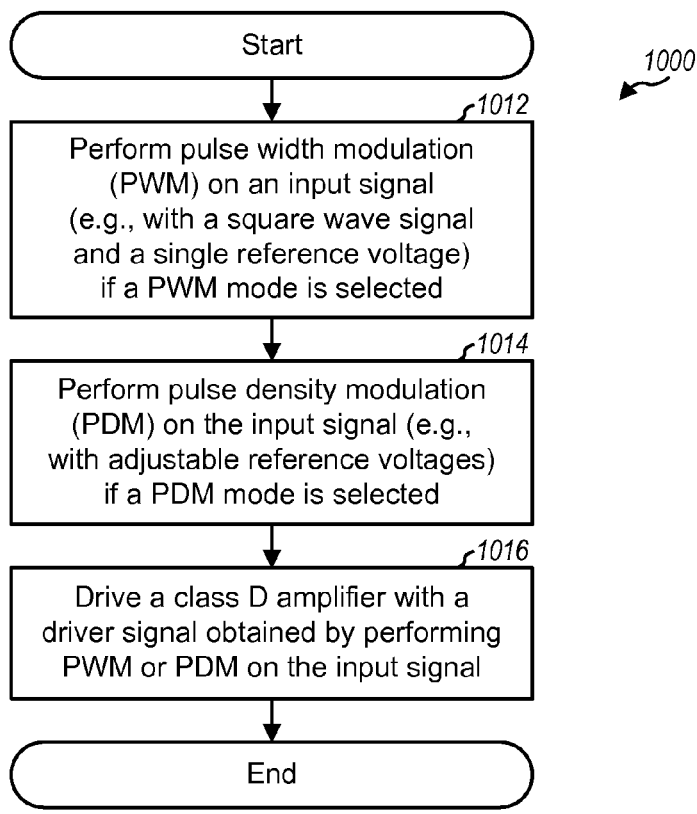
FIG. 10 shows a process for operating an output circuit.

FIG. 10 shows a process 1000 for operating a dual-mode output circuit. Pulse width modulation (PWM) is performed on an input signal (e.g., with a square wave signal and a single reference voltage) if a PWM mode is selected (block 1012). Pulse density modulation (PDM) is performed on the input signal (e.g., with adjustable reference voltages) if a PDM mode is selected (block 1014). A class D amplifier is driven with a driver signal obtained by performing PWM or PDM on the input signal (block 1016).

FIGS. 3, 4, 6, 7 and 8 show use of a first-order summing integrator for the input stage of the PWM and/or PDM modulator. Other circuits may also be used for the input stage. For example, the input stage may be implemented with a higher order integrator, a difference amplifier followed by a filter (e.g., as shown in FIG. 5), or some other circuit.

An output circuit may have various configurable circuit components in a pulse modulator and/or a class D amplifier. For the pulse modulator, integrator capacitors 126, 526 and 726 may have configurable values that may be selected via a control signal. For example, one capacitor value may be selected for the PWM mode and another capacitor value may be selected for the PDM mode. Input resistors 124, 524 and 724, feedback resistors 128, 528 and 728, and/or coupling resistors 142 and 742 may also have different configurable values that may be selected via control signals. The capacitor and resistor values may be selected to obtain the desired circuit characteristics.

Different switching frequencies may be supported in the PWM mode by applying different clock frequencies to a fixed divider or by using different divider ratios with a fixed clock frequency. For example, switching frequencies of 2.4 MHz down to 300 KHz may be obtained with a clock frequency of 19.2 MHz and divider ratios of 8 to 64, respectively. The nominal comparator window size $\Delta V$ may be configurable based on, e.g., the desired switching frequency in the PDM mode. For both PWM and PDM modes, the midscale reference voltage $V_{mid}$ may be configurable based on, e.g., the power supply voltage $V_{dd}$.

For the class D amplifier, P-FETs 154, 554 and 754 and N-FETs 156, 556 and 756 may be designed with configurable slew rates. Drivers 152, 552 and 752 may generate the control signals for the P-FETs and N-FETs with different non-overlap durations. These configurable features may be implemented with appropriate circuits. For example, different slew rates may be achieved with multiple FETs in parallel and turning on different numbers of FETs. Different non-overlap durations may be achieved by generating the control signals with different amounts of delay.

The output drivers described herein may be used for wireless communication devices, handheld devices, gaming devices, computing devices, computers, laptop computers, consumer electronics devices, etc. An exemplary use of the output drivers for a wireless communication device is described below.

Figure 11:
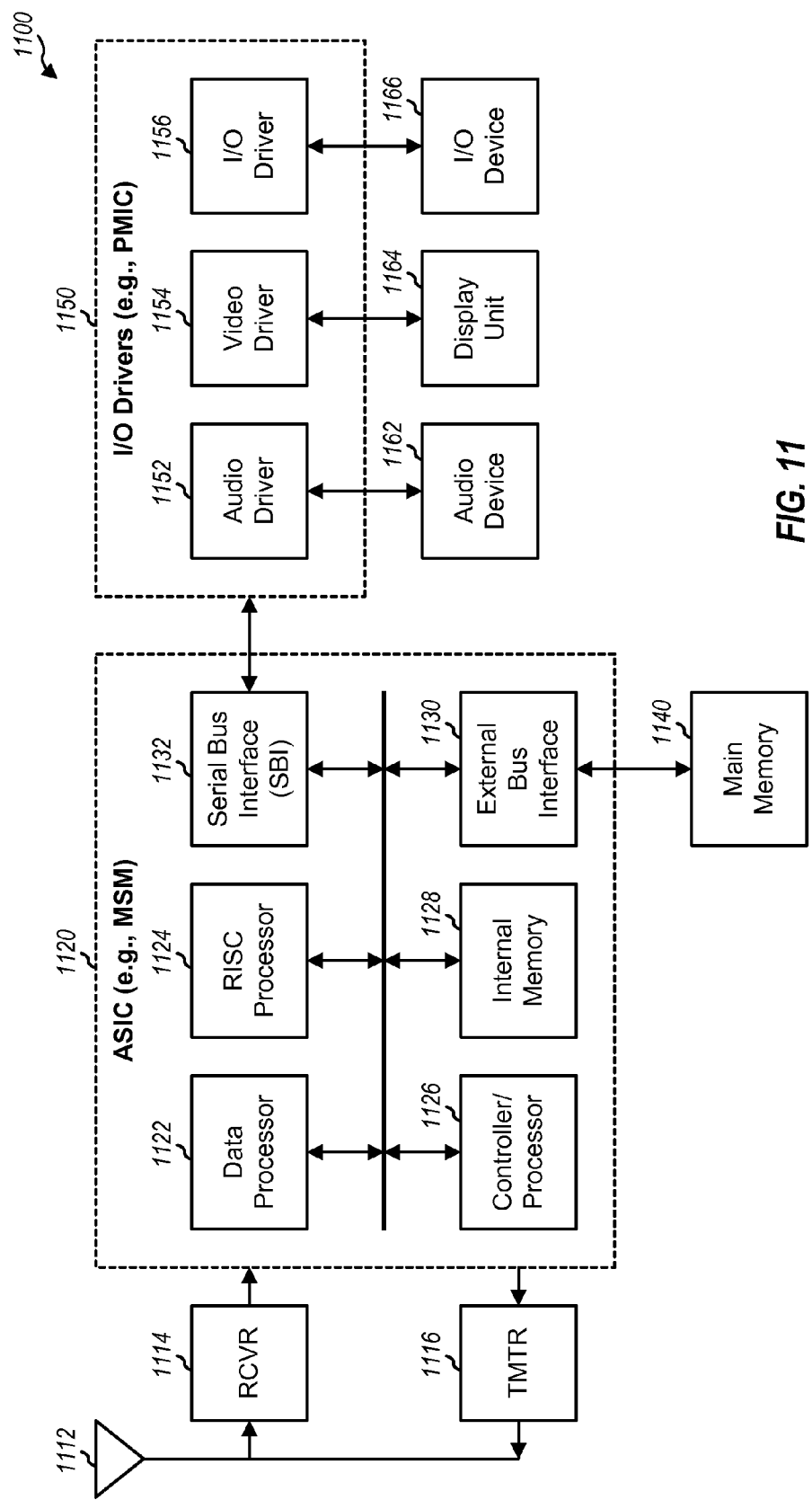
FIG. 11 shows a wireless communication device with at least one output circuit.

FIG. 11 shows a block diagram of a design of a wireless communication device 1100 in a wireless communication system. Wireless device 1100 may be a cellular phone, a terminal, a handset, a personal digital assistant (PDA), etc. The wireless communication system may be a Code Division Multiple Access (CDMA) system, a Global System for Mobile Communications (GSM) system, etc.

Wireless device 1100 is capable of providing bi-directional communication via a receive path and a transmit path. On the receive path, signals transmitted by base stations are received by an antenna 1112 and provided to a receiver (RCVR) 1114. Receiver 1114 conditions and digitizes the received signal and provides samples to an application specific integrated circuit (ASIC) 1120 for further processing. On the transmit path, a transmitter (TMTR) 1116 receives data from ASIC 1120, processes and conditions the data, and generates a modulated signal, which is transmitted via antenna 1112 to the base stations.

ASIC 1120 may include various processing, interface and memory units such as, e.g., a data processor 1122, a reduced instruction set computing (RISC) processor 1124, a controller/processor 1126, an internal memory 1128, an external bus interface (EBI) 1130, and a serial bus interface (SBI) 1132. Data processor 1122 performs processing for data transmission and reception, e.g., encoding, modulation, demodulation, decoding, etc. RISC processor 1124 may perform various types of processing for wireless device 1100, e.g., processing for video, graphics, higher layer applications, etc. Controller/processor 1126 may direct the operation of various processing and interface units within ASIC 1120. Internal memory 1128 stores data and/or instructions for various units within ASIC 1120. EBI 1130 facilitates transfer of data between ASIC 1120 and a main memory 1140. SBI 1132 facilitates communication between ASIC 1120 and an ASIC 1150.

ASIC 1150 may include various input/output (I/O) drivers such as, e.g., an audio driver 1152, a video driver 1154, and an I/O driver 1156. Audio driver 1152 drives an audio device 1162, which may be a speaker, a headset, an earpiece, etc. Video driver 1154 drives a display unit 1164, which may be a liquid crystal display (LCD), etc. I/O driver 1156 drives an I/O device 1166 via an output interface such as Universal Serial Bus (USB), RJ45 or Ethernet, etc. Audio driver 1152, video driver 1154, and/or I/O driver 1156 may be implemented with the output circuits described herein.

ASIC 1120 may be a Mobile Station Modem (MSM) from Qualcomm Incorporated. ASIC 1150 may be a Power Management IC (PMIC) from Qualcomm Incorporated. ASICs 1120 and 1150 may also be other ASICs from other manufacturers.

The output circuits described herein may be fabricated in various IC processes such as N-channel metal oxide semiconductor (N-MOS), P-channel MOS (P-MOS), complementary MOS (CMOS), bipolar, bipolar-CMOS (Bi-CMOS), gallium arsenide (GaAs), etc. The output circuits may also be fabricated on various types of IC such as analog ICs, digital ICs, radio frequency ICs (RFICs), etc.

An output circuit described herein may be implemented on a device. The device may be (i) a stand-alone IC such as a driver IC or a PMIC, (ii) an ASIC such as a Mobile Station Modem (MSM), (iii) a circuit that may be embedded within other devices, (iv) a cellular phone, wireless device, handset, or mobile unit, (vi) etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A device comprising:
   a pulse modulator configured to perform pulse width modulation (PWM) on an input signal if a PWM mode is selected, to perform pulse density modulation (PDM) on the input signal if a PDM mode is selected, and to provide a driver signal; and
   a class D amplifier configured to receive the driver signal and generate an output signal, wherein the output signal is fed back in to the pulse modulator.

2. The device of claim 1, wherein the pulse modulator comprises an integrator configured to receive, sum and integrate the input signal and the output signal and to provide an integrated signal.

3. The device of claim 2, wherein the integrator comprises a capacitor having a selectable value.

4. The device of claim 3, wherein the capacitor has a first value in the PWM mode and a second value in the PDM mode.

5. The device of claim 2, wherein the pulse modulator further comprises a clock divider configured to receive a clock signal, to divide the clock signal in frequency, and to provide a square wave signal, and wherein the integrator is further configured to receive, sum and integrate the square wave signal in the PWM mode.

6. The device of claim 1, wherein the pulse modulator comprises a comparator configured to receive an analog signal and generate the driver signal.

7. The device of claim 6, wherein the pulse modulator further comprises a reference generator configured to generate a single reference voltage for the comparator in the PWM mode and to generate first and second reference signals for the comparator in the PDM mode.

8. The device of claim 1, wherein the pulse modulator is implemented with a differential design and comprises a non-inverting path and an inverting path.

9. The device of claim 1, wherein the class D amplifier comprises a driver configured to receive the driver signal and generate first and second control signals, a pull-up transistor configured to receive the first control signal and provide pull-up for the output signal, and a pull-down transistor configured to receive the second control signal and provide pull-down for the output signal.

10. The device of claim 9, wherein the pull-up and pull-down transistors have configurable slew rate.

11. The device of claim 9, wherein the first and second control signals are generated with variable non-overlap duration.

12. An integrated circuit comprising:
    a pulse modulator configured to perform pulse width modulation (PWM) on an input signal if a PWM mode is selected, to perform pulse density modulation (PDM) on the input signal if a PDM mode is selected, and to provide a driver signal; and
    a class D amplifier configured to receive the driver signal and generate an output signal, wherein the output signal is fed back in to the pulse modulator.

13. The integrated circuit of claim 12, wherein the pulse modulator comprises an integrator configured to receive, sum and integrate the input signal and the output signal and to provide an integrated signal.

14. The integrated circuit of claim 13, wherein the pulse modulator further comprises a clock divider configured to receive a clock signal, to divide the clock signal in frequency, and to provide a square wave signal, and wherein the integrator is further configured to receive, sum and integrate the square wave signal in the PWM mode.

15. The integrated circuit of claim 12, wherein the pulse modulator further comprises a reference generator configured to generate a single reference voltage in the PWM mode and to generate first and second reference signals in the PDM mode.

16. A method comprising:
    performing pulse width modulation (PWM) on an input signal if a PWM mode is selected;
    performing pulse density modulation (PDM) on the input signal if a PDM mode is selected;
    driving a class D amplifier with a driver signal obtained by performing PWM or PDM on the input signal; and
    feeding back an output signal of the class D amplifier to be used in performing PWM or PDM.

17. The method of claim 16, wherein the performing PWM on the input signal comprises performing PWM on the input signal with a square wave signal if the PWM mode is selected.

18. The method of claim 16, wherein the performing PWM comprises performing PWM on the input signal with a single reference voltage if the PWM mode is selected, and wherein the performing PDM comprises performing PDM on the input signal with multiple adjustable reference voltages if the PDM mode is selected.

19. An apparatus comprising:
means for performing pulse width modulation (PWM) on an input signal if a PWM mode is selected;
means for performing pulse density modulation (PDM) on the input signal if a PDM mode is selected;
means for driving a class D amplifier with a driver signal obtained by performing PWM or PDM on the input signal; and
means for feeding back an output signal of the class D amplifier to be used in performing PWM or PDM.

20. The apparatus of claim 19, wherein the means for performing PWM comprises on the input signal comprises means for performing PWM on the input signal with a square wave signal if the PWM mode is selected.

21. The apparatus of claim 19, wherein the means for performing PWM comprises means for performing PWM on the input signal with a single reference voltage if the PWM mode is selected, and wherein the means for performing PDM comprises means for performing PDM on the input signal with multiple adjustable reference voltages if the PDM mode is selected.

\* \* \* \* \*